(12) United States Patent
Chen et al.

(10) Patent No.: US 12,009,818 B2
(45) Date of Patent: Jun. 11, 2024

(54) DUAL-PORT SRAM

(71) Applicant: Shanghai Huali Integrated Circuit Corporation, Shanghai (CN)

(72) Inventors: Pinhan Chen, Shanghai (CN); Chenglei Guo, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 157 days.

(21) Appl. No.: 17/872,445

(22) Filed: Jul. 25, 2022

(65) Prior Publication Data
US 2023/0035789 A1   Feb. 2, 2023

(30) Foreign Application Priority Data

Jul. 27, 2021   (CN) .......................... 202110848205.5

(51) Int. Cl.
*G11C 11/412* (2006.01)
*H03K 19/017* (2006.01)
*H03K 19/0944* (2006.01)
*H03K 19/1776* (2020.01)

(52) U.S. Cl.
CPC ........ *H03K 19/1776* (2013.01); *G11C 11/412* (2013.01); *H03K 19/01721* (2013.01); *H03K 19/0944* (2013.01)

(58) Field of Classification Search
CPC .............. G11C 11/412; H03K 19/1776; H03K 19/01721; H03K 19/0944
USPC ........................................................ 365/181
See application file for complete search history.

(56) References Cited

U.S. PATENT DOCUMENTS

2021/0035986 A1* 2/2021 Yu .......................... H10B 10/12

* cited by examiner

*Primary Examiner* — Alexander Sofocleous
*Assistant Examiner* — Tracy R Hampton
(74) *Attorney, Agent, or Firm* — Banner & Witcoff, Ltd.

(57) ABSTRACT

The present application discloses a dual-port SRAM having two ports. On a layout, pass gates connecting to the two ports are disposed near pull down transistors of corresponding memory nodes. A cell layout structure of the SRAM cell structure is centrosymmetric. In a first subunit layout structure, a pass gate and a first pull down transistor share the same active region, and an active region of the other pull down transistor is disposed between active regions of the first pull down transistor and a first pull up transistor. The present application improves the symmetry of read paths of the two memory nodes from two ports thus the symmetry of read currents, therefore the variation of the electrical performance of PMOS transistors is reduced and the stability of the electrical performance of the PMOS transistors is improved.

13 Claims, 9 Drawing Sheets

DUAL-PORT SRAM

CROSS-REFERENCES TO RELATED APPLICATIONS

This application claims the priority to Chinese patent application No. CN 202110848205.5, filed on Jul. 27, 2021 at the CNIPA, and entitled "DUAL-PORT SRAM", the disclosure of which is incorporated herein by reference in entirety.

TECHNICAL FIELD

The present application relates to semiconductor integrated circuits, in particular, to a dual-port static random access memory (SRAM).

BACKGROUND

SRAMs include array structures arranged with many SRAM cell arrays. In a dual-port SRAM, each SRAM cell structure contains two ports, so reading and writing are performed on each SRAM cell structure via the two ports. Concurrent operations on two different rows in the SRAM cell array can be achieved by configuring the two ports, shown in FIGS. 1-5. FIG. 1 is a circuit diagram of an SRAM cell structure of an existing dual-port SRAM. The SRAM cell structure in FIG. 1 is an 8T SRAM structure having eight transistors. This dual-port SRAM cell structure includes: a data memory unit main structure, a first port structure, and a second port structure. In FIG. 1, the first port is port A, and the second port is port B.

The data memory unit main structure is formed by cross-coupling a first inverter with a second inverter, at a first memory node node1 and a second memory node node2, so the two parts in the main structure are mutually inverted. The first inverter includes a first pull up (PU) transistor PU1 and a first pull down (PD) transistor PD1. The second inverter includes a second pull up transistor PU2 and a second pull down transistor PD2.

The first port structure includes a first pass gate (PG) PG1 and a second pass gate PG2, and the second port structure includes a third pass gate PG3 and a fourth pass gate PG4.

A metal conductive material layer 111 (in FIG. 5C) of a metal gate of the first pass gate PG1 and a metal conductive material layer 111 of a metal gate of the second pass gate PG2 are both connected to a first word line (WL) A_WL.

In FIG. 5C, metal conductive material layer 111 of the metal gate of the third pass gate PG3 and a metal conductive material layer 111 of a metal gate of the fourth pass gate PG4 are both connected to a second word line B_WL.

A source region of the first pass gate PG1 is connected to the first memory node node1, and a drain region of the first pass gate PG1 is connected to a first bit line (BL) A_BL. A source region of the second pass gate PG2 is connected to the second memory node node2, and a drain region of the second pass gate PG2 is connected to a second bit line A_BLB. The first bit line A_BL and the second bit line A_BLB form a first pair of complementary bit lines.

A source region of the third pass gate PG3 is connected to the second memory node node2, and a drain region of the third pass gate PG3 is connected to a third bit line B_BL. A source region of the fourth pass gate PG4 is connected to the first memory node node1, and a drain region of the fourth pass gate PG4 is connected to a fourth bit line B_BLB. The third bit line B_BL and the fourth bit line B_BLB form a second pair of complementary bit lines.

A layout structure of the SRAM cell structure of the existing dual-port SRAM is described as the following:

Referring to FIG. 2, which is a layout of the existing dual-port SRAM cell structure. FIG. 2 shows the layout of overlaying structures from stacked multiple layers. The first pull up transistor PU1 and the second pull up transistor PU2 are both PMOS transistors. The first pull down transistor PD1, the second pull down transistor PD2, the first pass gate PG1, the second pass gate PG2, the third pass gate PG3, and the fourth pass gate PG4 are all NMOS transistors.

The middle region between the dashed lines AA and BB in FIG. 2 contains the first pull up transistor PU1 and the second pull up transistor PU2, both are PMOS transistors. The first pull up transistor PU1 is formed in an active region 101c, the second pull up transistor PU2 is formed in an active region 101d, and the active regions 101c and 101d are both located in an N-type well.

The first pull down transistor PD1 is formed in a region on the left side of the dashed line AA, and the second pull down transistor PD2 is formed in a region on the right side of the dashed line BB in FIG. 2.

The first pass gate PG1 and the second pass gate PG2 of the first port structure are also formed in the region on the left side of the dashed line AA. The third pass gate PG3 and the fourth pass gate PG4 of the second port structure are also formed in the region on the right side of the dashed line BB.

From FIG. 2, the first pull down transistor PD1 and the first pass gate PG1 for reading the first memory node node1 both share the active region 101b for drain regions. The second pass gate PG2 for reading the second memory node node2 comprising a drain region of the second pull down transistor PD2 is formed separately in the active region 101a. The layout structures of the region on the right side of the dashed line BB and the region on the left side of the dashed line AA are centrosymmetric structures, that is, the second pull down transistor PD2 and the third pass gate PG3 are both formed in an active region 101e, and the fourth pass gate PG4 is formed separately in an active region 101f. The active regions 101a and 101b are both formed in a P-type well on the left side of the dashed line AA, and the active regions 101e and 101f are both formed in a P-type well on the right side of the dashed line BB.

The metal conductive material layers 111 of the metal gates of the first pull down transistor PD1 and the first pull up transistor PU1 are connected to form a metal gate strip 102a, and the metal conductive material layers of the metal gates of the first pass gate PG1 and the second pass gate PG2 are connected to form a metal gate strip 102b. The metal conductive material layers 111 of the metal gates of the second pull down transistor PD2 and the second pull up transistor PU2 are connected to form a metal gate strip 102d, and the metal conductive material layers 111 of the metal gates of the third pass gate PG3 and the fourth pass gate PG4 are connected to form a metal gate strip 102c.

The source region of the first pass gate PG1 are shared by the first pass gate PG1 and the first memory node node1 comprising the drain region of the first pull down transistor PD1. The drain region of the first pass gate PG1 is connected to a first metal layer 104 corresponding to the first bit line A_BL by means of a corresponding contact 103. A source region of the first pull down transistor PD1 is connected to the first metal layer 104 corresponding to a ground line Vss by means of the corresponding contact 103.

The drain region of the second pass gate PG2 is connected to the first metal layer 104 corresponding to the second bit line A_BLB by means of the corresponding contact 103. The source region of the second pass gate PG2 is connected to the corresponding metal gate strip 102a by means of the corresponding contact 103. The metal gate strip 102b is connected to the first metal layer 104 corresponding to the first word line A_WL by means of the corresponding contact 103.

A source region of the first pull up transistor PU1 is connected to the first metal layer 104 corresponding to a power supply voltage line Vdd by means of the corresponding contact 103. A drain region of the first pull up transistor PU1 and the drain region of the first pull down transistor PD1 are connected to the corresponding first metal layer 104 by means of the contact 103. The drain region of the first pull up transistor PU1 is also connected to the metal gate strip 102d by means of the corresponding contact 103.

The source region of the third pass gate PG3 are shared by the third pass gate PG3 and the second memory node node2 comprising the drain region of the second pull down transistor PD2. The drain region of the third pass gate PG3 is connected to the first metal layer 104 corresponding to the third bit line B_BL by means of the corresponding contact 103. A source region of the second pull down transistor PD2 is connected to the first metal layer 104 corresponding to the ground line Vss by means of the corresponding contact 103.

The drain region of the fourth pass gate PG4 is connected to the second metal layer 104 corresponding to the second bit line A_BLB by means of the corresponding contact 103. The source region of the fourth pass gate PG4 is connected to the corresponding metal gate strip 102d by means of the corresponding contact 103. The metal gate strip 102c is connected to the first metal layer 104 corresponding to the second word line B_WL by means of the corresponding contact 103.

A source region of the second pull up transistor PU2 is connected to the first metal layer 104 corresponding to the power supply voltage line Vdd by means of the corresponding contact 103. A drain region of the second pull up transistor PU2 and the drain region of the second pull down transistor PD2 are connected to the corresponding first metal layer 104 by means of the contact 103. The drain region of the second pull up transistor PU2 is also connected to the metal gate strip 102a by means of the corresponding contact 103.

The layout structure shown in FIG. 2 may lead to inconsistent read paths corresponding to transistors of the same port. For example, read paths corresponding to PG1 and PG2 of Port A are inconsistent, and read paths corresponding to PG3 and PG4 of Port B are inconsistent. The reason leading to the inconsistency is as follows: the ports of the dual-port SRAM comprising eight transistors are generally consistent, and therefore the dimensions of components PG1, PG2, PG3, and PG4, such as the width and length, are the same. However, due to the inconsistency caused by the layout, the read paths are different.

Referring to FIG. 3A, which is a schematic diagram of a first current path and a third current path in the layout of the SRAM cell structure of the existing dual-port SRAM shown in FIG. 2, the first current path corresponds to a path of a current Iread1, and the third current path corresponds to a path of a current Iread3.

Referring to FIG. 3B, which is a schematic diagram of a second current path and a fourth current path in the layout of the SRAM cell structure of the existing dual-port SRAM shown in FIG. 2, the second current path corresponds to a path of a current Iread2, and the fourth current path corresponds to a path of a current Iread4. It can be seen that the second current path passes through the metal gate strip 102a and the first metal layer 104 connected to the top of the second memory node node2; and the fourth current path passes through the metal gate strip 102d and the first metal layer 104 connected to the top of the first memory node node1.

Referring to FIG. 4A, which is a circuit diagram of the first current path and the third current path corresponding to the SRAM cell structure of the existing dual-port SRAM shown in FIG. 2, it can be seen that the current Iread1 directly passes through the first pass gate PG1 and the first pull down transistor PD1; and the current Iread3 directly passes through the third pass gate PG3 and the second pull down transistor PD2.

Referring to FIG. 4B, which is a circuit diagram of the second current path and the fourth current path corresponding to the SRAM cell structure of the existing dual-port SRAM shown in FIG. 2, it can be seen that the current Iread2 directly passes through the second pass gate PG2, a parasitic structure 201 comprising the metal gate strip 102a and the first metal layer 104 connected to the top of the second memory node node2, and the second pull down transistor PD2; and the current Iread4 directly passes through the fourth pass gate PG4, a parasitic structure 201 comprising the metal gate strip 102d and the first metal layer 104 connected to the top of the first memory node node1, and the first pull down transistor PD1.

It can be seen that the paths of the currents Iread1 to Iread4 are asymmetric structures, so that the currents Iread2 and Iread4 are less than the currents Iread1 and Iread3, and corresponding read speeds are also slower.

In addition to the defect of asymmetric current paths, the layout of the SRAM cell structure of the existing dual-port SRAM shown in FIG. 2 also has the following defects:

FIG. 5A is a layout in which a process layer, i.e., a first metal layer, is removed and a P-type metal work function layer (PWF) is added on the basis of FIG. 2. FIG. 5B is an enlarged view of the dashed line box 203 in FIG. 5A. FIG. 5C is a cross sectional structural view along the line CC in FIG. 5B. As can be seen FIG. 5A, the metal conductive material layers 111 of the metal gates of the first pull down transistor PD1 and the first pull up transistor PU1 share the metal gate strip 102a. During the process of forming the metal gates of the first pull down transistor PD1 and the first pull up transistor PU1, the metal conductive material layers 111 of the metal gates are formed simultaneously. Referring to FIG. 5C, in addition to the metal conductive material layer 111 of the metal gate, the metal gates of the first pull down transistor PD1 and the first pull up transistor PU1 each further include the following.

The metal gate (MG) of the PMOS, i.e., the first pull up transistor PU1, includes a P-type metal work function layer 105, an N-type metal work function layer (NWF) 109, and the metal conductive material layer 111 stacked in sequence.

The metal gate of the NMOS, i.e., the first pull down transistor PD1, includes the N-type metal work function layer 109 and the metal conductive material layer 111 stacked in sequence.

A gate dielectric layer 107 is formed at the bottom of the metal gate of each of the PMOS and the NMOS. The gate dielectric layer 107 includes a high dielectric constant layer, and the material of the high dielectric constant layer includes hafnium dioxide ($HfO_2$).

A bottom barrier layer (BBM) 108 is formed on the surface of the gate dielectric layer 107, and a top barrier layer (TBM) 110 is formed on the surface of the N-type metal work function layer 109.

The material of the P-type metal work function layer 105 includes TiN.

The material of the N-type metal work function layer 109 includes titanium aluminide (TiAl).

The material of the metal conductive material layer 111 includes aluminum Al.

The material of the bottom barrier layer 108 includes a stack layer of titanium nitride (TiN) and tantalum nitride (TaN), and the material of the top barrier layer 110 includes TiN.

Usually, the metal gates of the PMOS and the NMOS are integrated and formed together. In the integrated formation process, after the P-type metal work function layer 105 is formed, a photolithography process, therefore an expensive photomask is required, to remove the P-type metal work function layer 105 in an NMOS formation region through etching. However, the N-type metal work function layer 109 can be located in the formation regions of both NMOS and PMOS.

It can be seen from the enlarged layout in FIG. 5B that, the boundary of the P-type metal work function layer 105 corresponding to the dashed line CC1 serves as a metal work function layer boundary between the P-type metal work function layer 105 and the N-type metal work function layer 109 of the first pull down transistor PD1 on the left side. There is a space d101 between the metal work function layer boundary CC1 and the active region 101b on the left side, and there is a tight space d102 between the metal work function layer boundary CC1 and the active region 101c on the right side.

Similarly, referring to FIG. 5A, a metal work function layer boundary between the P-type metal work function layer 105 and the N-type metal work function layer 109 of the second pull down transistor PD2 on the right is distant from the active regions 101e and 101d on two sides thereof by spaces d103 and d104, respectively.

As the size of the device shrinks, the spaces d101 to d104 become tighter through the dimension shrinking. However, as shown in the cross sectional view of FIG. 5C, when the N-type metal work function layer 109 and the P-type metal work function layer 105 are laterally in contact, aluminum (Al) ions in the TiAl layer of the N-type metal work function layer 109 are likely to diffuse laterally into the P-type metal work function layer 105, thereby affecting the work function of the P-type metal work function layer 105. For PMOS transistor, the active region covered by the metal gate is used to form a channel region, when a gate voltage is greater than a threshold voltage, the surface of the channel region will reverse to form a conduction channel, the threshold voltage is adjusted by the work function of the P-type metal work function layer 105. When the spaces d101 and d102 are very tight compared to the diffusion length of Al, which is longer than the space d102, Al ions enter the active region of the PMOS, e.g., the P-type metal work function layer 105 on the top of the active region 101c in FIG. 5C, causing an impact on the threshold voltage of the PMOS transistors, and thereby resulting in a variation in the performance of the PMOS transistors.

BRIEF SUMMARY

The present application discloses a dual-port SRAM, which improves the symmetry of read paths of the two memory nodes from two ports, therefore the symmetry of read currents, as a result, the variation in the electrical performance of the PMOS transistors is reduced, thereby the stability of the electrical performance of the PMOS transistors is improved.

An SRAM cell structure in the dual-port SRAM provided by the present application includes: a data memory unit main structure, a first port structure, and a second port structure.

The data memory unit main structure is formed by cross-coupling a first inverter with a second inverter, resulting in mutually inverted first memory node and second memory node.

The first port structure comprises a first pass gate and a second pass gate, and the second port structure includes a third pass gate and a fourth pass gate.

The first inverter comprises a first pull up transistor and a first pull down transistor.

The second inverter comprises a second pull up transistor and a second pull down transistor.

The first pull up transistor and the second pull up transistor are both PMOS transistors; the first pull down transistor, the second pull down transistor, the first pass gate, the second pass gate, the third pass gate, and the fourth pass gate are all NMOS transistors.

A cell layout structure of the SRAM cell structure comprises a first subunit layout structure and a second subunit layout structure that are centrosymmetric to each other, the first subunit layout structure comprises a layout of the first pull down transistor, the first pull up transistor, the first pass gate, and the fourth pass gate, and the second subunit layout structure comprising of a layout of the second pull down transistor, the second pull up transistor, the second pass gate, and the third pass gate.

The first subunit layout structure includes:
  a first active region, a second active region, and a third active region arranged in sequence in a first direction. The second active region is located between the first active region and the third active region, and the first active region, the second active region, and the third active region all extend in a second direction perpendicular to the first direction.

The first pull up transistor is formed in the third active region.

The first pull down transistor is located in the first active region, and a drain region of the first pull down transistor forms the first memory node.

A metal conductive material layer of a metal gate of the first pull up transistor and a metal conductive material layer of a metal gate of the first pull down transistor are connected to form a first metal gate strip extending in the first direction, a first metal work function layer boundary between a P-type metal work function layer of the metal gate of the first pull up transistor and an N-type metal work function layer formed by the metal gate of the first pull down transistor is located on the top of a field oxide layer between the first active region and the third active region, and the arrangement of the second active region between the first active region and the third active region leads to an increase in both a first space between the first metal work function layer boundary and the first active region and a second space between the first metal work function layer boundary and the third active region, thereby increasing the stability of the electrical performance of the first pull up transistor.

A source region of one of the first pass gate and the fourth pass gate is the first memory node and is located in the first active region, and a source region of the other one of the first pass gate and the fourth pass gate is located in the second active region and is connected to the first memory node via a contact hole and a first metal layer, so that neither of read paths of the first memory node passes through the metal conductive material layer of the metal gate connected to the first memory node, thereby increasing the symmetry of the two read paths of the first memory node.

In an improvement, the second subunit layout structure includes:

a fourth active region, a fifth active region, and a sixth active region arranged in sequence in the first direction. The fifth active region is located between the fourth active region and the sixth active region, and the fourth active region, the fifth active region, and the sixth active region all extend in the second direction perpendicular to the first direction.

The second pull up transistor is formed in the sixth active region.

The second pull down transistor is located in the fourth active region, and a drain region of the second pull down transistor forms the second memory node.

A metal conductive material layer of a metal gate of the second pull up transistor and a metal conductive material layer of a metal gate of the second pull down transistor are connected to form a second metal gate strip extending along the first direction, a second metal work function layer boundary between a P-type metal work function layer of the metal gate of the second pull up transistor and an N-type metal work function layer formed by the metal gate of the second pull down transistor is located on the top of a field oxide layer between the fourth active region and the sixth active region, and the arrangement of the fifth active region between the fourth active region and the sixth active region leads to an increase in both a third space between the second metal work function layer boundary and the fourth active region and a fourth space between the second metal work function layer boundary and the sixth active region, thereby increasing the stability of the electrical performance of the second pull up transistor.

A source region of one of the second pass gate and the third pass gate is the second memory node and is located in the fourth active region, and a source region of the other one of the second pass gate and the third pass gate is located in the fifth active region and is connected to the second memory node via a contact and the first metal layer, so that neither of read paths of the second memory node passes through the metal conductive material layer of the metal gate connected to the second memory node, thereby increasing the symmetry of the two read paths of the second memory node.

In an improvement, the third space is equal to the first space, and the fourth space is equal to the second space.

In an improvement, the fourth pass gate is formed in the first active region, and the first pass gate is formed in the second active region.

In an improvement, in the first active region, the fourth pass gate and the first pull down transistor are arranged along the second direction.

A metal conductive material layer of a metal gate of the fourth pass gate and a metal conductive material layer of a metal gate of the first pass gate are aligned with the second metal gate strip.

In an improvement, the width of a channel region of the fourth pass gate is equal to a first direction dimension of the first active region of a formation region of the fourth pass gate.

The width of a channel region of the first pull down transistor is equal to a first direction dimension of the first active region of a formation region of the first pull down transistor.

The width of the channel region of the first pass gate is equal to a first direction dimension of the second active region.

The width of the channel region of the fourth pass gate is less than the width of the channel region of the first pull down transistor, and the width of the channel region of the fourth pass gate is equal to the width of the channel region of the first pass gate.

In an improvement, the second pass gate is formed in the fourth active region, and the third pass gate is formed in the fifth active region.

In an improvement, in the fourth active region, the second pass gate and the second pull down transistor are arranged along the second direction.

A metal conductive material layer of a metal gate of the second pass gate and a metal conductive material layer of a metal gate of the third pass gate are aligned with the first metal gate strip.

In an improvement, the width of a channel region of the second pass gate is equal to a first direction dimension of the fourth active region of a formation region of the second pass gate.

The width of a channel region of the second pull down transistor is equal to a first direction dimension of the fourth active region of a formation region of the second pull down transistor.

The width of a channel region of the third pass gate is equal to a first direction dimension of the fifth active region.

The width of the channel region of the second pass gate is less than the width of the channel region of the second pull down transistor, and the width of the channel region of the second pass gate is equal to the width of the channel region of the third pass gate.

In an improvement, the top of the metal conductive material layer of the metal gate of the first pass gate is connected to the first metal layer corresponding to a first word line via a contact.

The top of the metal conductive material layer of the metal gate of the fourth pass gate is connected to the first metal layer corresponding to a second word line via a contact.

The top of a drain region of the first pass gate is connected to the first metal layer corresponding to a first bit line via a contact.

The top of a drain region of the fourth pass gate is connected to the first metal layer corresponding to a fourth bit line via a contact.

The top of a source region of the first pull down transistor is connected to the first metal layer corresponding to a ground line via a contact.

The top of the drain region of the first pull down transistor, the top of a source region of the first pass gate, the top of a drain region of the first pull up transistor, and the top of the second metal gate strip are respectively connected to the first metal layer corresponding to the first memory node via contacts.

The top of a source region of the first pull up transistor is connected to the first metal layer corresponding to a power supply voltage line via a contact.

In an improvement, the top of the metal conductive material layer of the metal gate of the second pass gate is connected to the first metal layer corresponding to a first word line via a contact.

The top of the metal conductive material layer of the metal gate of the third pass gate is connected to the first metal layer corresponding to a second word line via a contact.

The top of a drain region of the second pass gate is connected to the first metal layer corresponding to a second bit line via a contact.

The top of a drain region of the third pass gate is connected to the first metal layer corresponding to a third bit line via a contact.

The top of a source region of the second pull down transistor is connected to the first metal layer corresponding to a ground line via a contact.

The top of a drain region of the second pull down transistor, the top of a source region of the third pass gate, the top of a drain region of the second pull up transistor, and the top of the first metal gate strip are respectively connected to the first metal layer corresponding to the second memory node via contacts.

The top of a source region of the second pull up transistor is connected to the first metal layer corresponding to a power supply voltage line via a contact.

In an improvement, the first active region and the second active region are both located in a first P-well.

The third active region and the sixth active region are both located in an N-well.

The fourth active region and the fifth active region are both located in a second P-well.

On the cell layout structure of the SRAM cell structure, the N-well is located in a middle region, and the first P-well and the second P-well are located on two sides of the N-well.

In an improvement, the metal gate of the PMOS includes the P-type metal work function layer, the N-type metal work function layer, and the metal conductive material layer stacked in sequence.

The metal gate of the NMOS comprises the N-type metal work function layer and the metal conductive material layer stacked in sequence.

In an improvement, a gate dielectric layer is formed at the bottom of the metal gate of each of the PMOS and the NMOS, and the gate dielectric layer comprises a high dielectric constant layer.

A bottom barrier layer is formed on the surface of the gate dielectric layer, and a top barrier layer is formed on the surface of the N-type metal work function layer.

In an improvement, the material of the P-type metal work function layer comprises titanium nitride (TiN).

The material of the N-type metal work function layer comprises TiAl.

The material of the metal conductive material layer comprises Al.

In an improvement, the material of the high dielectric constant layer includes hafnium dioxide, the material of the bottom barrier layer includes a stack layer of TiN and TaN, and the material of the top barrier layer includes TiN.

In the present application, the cell layout structure of the SRAM cell structure comprises the first subunit layout structure and the second subunit layout structure that are centrosymmetric to each other. The first subunit layout structure includes a pass gate of the first port structure, i.e., the first pass gate, and a pass gate of the second port structure, i.e., the fourth pass gate, so that the first pass gate and the fourth pass gate are disposed adjacent to the first memory node in the first subunit layout structure and that neither of the two read paths of the first memory node passes through the metal conductive material layer of the metal gate connected to the first memory node, thereby increasing the symmetry of the two read paths of the first memory node. Since the first subunit layout structure and the second subunit layout structure are centrosymmetric, the symmetry of the read paths of the two memory nodes from each port can be eventually improved, thereby improving the symmetry of read currents.

Moreover, in the first subunit layout structure of the present application, one pass gate and the first pull down transistor are formed in the same active region, i.e., the first active region, and the other pass gate is separately disposed in the second active region. The second active region is disposed between the first active region and the third active region of the first pull up transistor. In this way, a space between the first active region and the third active region can be increased. Accordingly, the first space between the first active region and the first metal work function layer boundary which is formed by a lateral contact between side surfaces of the P-type metal work function layer of the metal gate of the first pull up transistor comprises the PMOS and the N-type metal work function layer of the metal gate of the first pull down transistor, and the second space between the first metal work function layer boundary and the third active region both can be increased. The channel region of the first pull up transistor is the third active region covered by the metal gate. Therefore, after the first space and the second space are increased, the amount of impurities in the N-type metal work function layer of the first pull down transistor diffused into the P-type metal work function layer on the top of the channel region of the first pull up transistor can be reduced, reducing the variation amount of the electrical performance of the PMOS and thereby improving the stability of the electrical performance of the PMOS.

BRIEF DESCRIPTION OF THE DRAWINGS

The present application is described in detail below with reference to the drawings and specific implementations.

DETAILED DESCRIPTION OF THE DISCLOSURE

Figure 1:
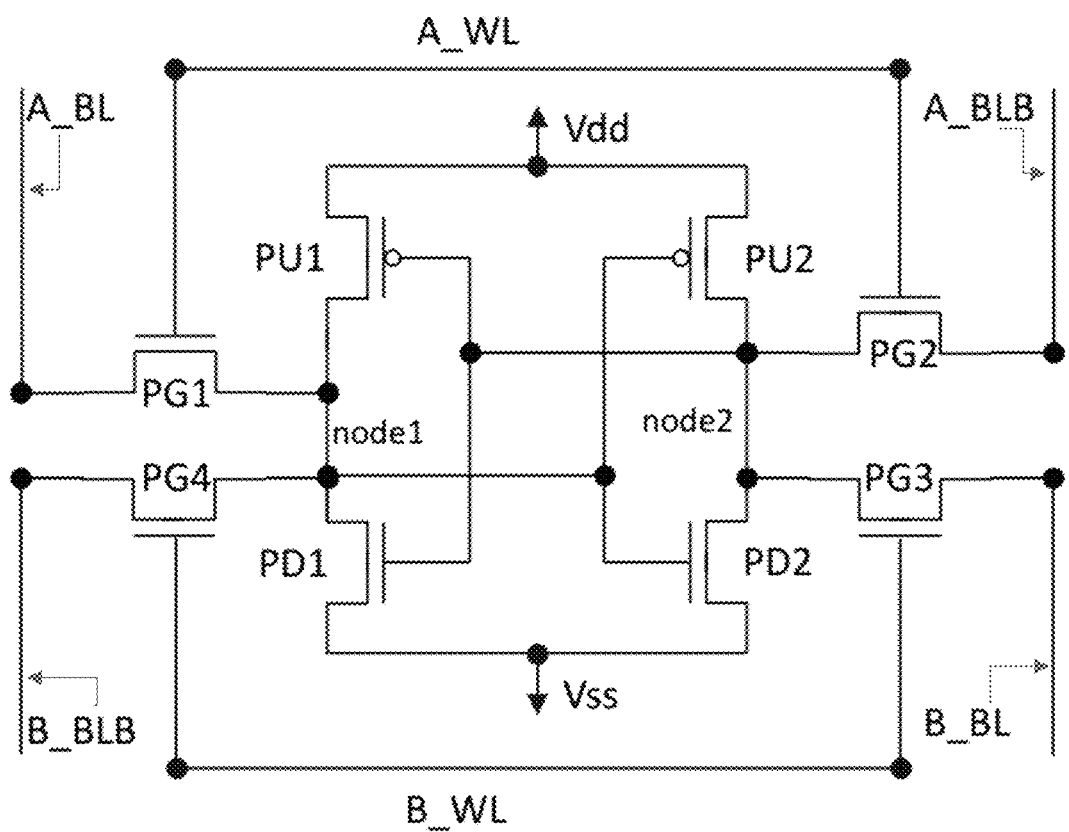
FIG. 1 is a circuit diagram of an SRAM cell structure of an existing dual-port SRAM.
Figure 2:
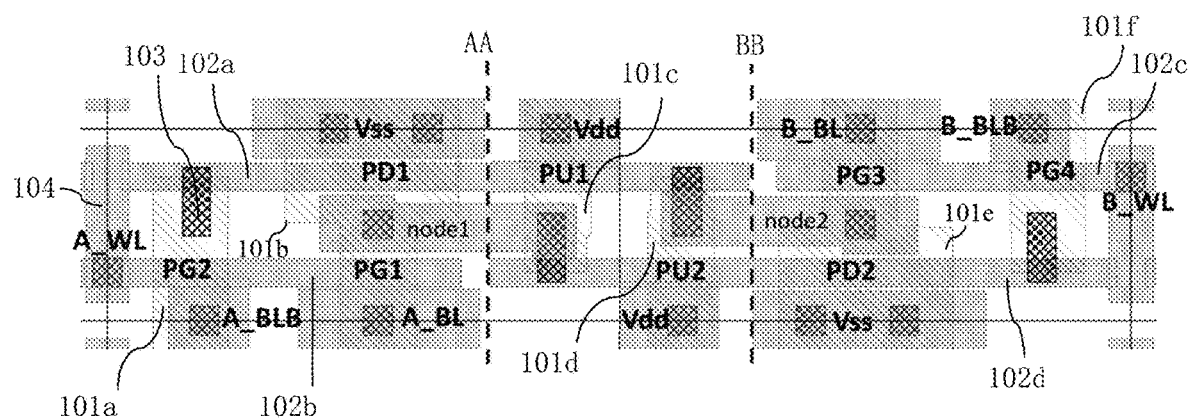
FIG. 2 is a layout of the SRAM cell structure of the existing dual-port SRAM.
Figure 3A:
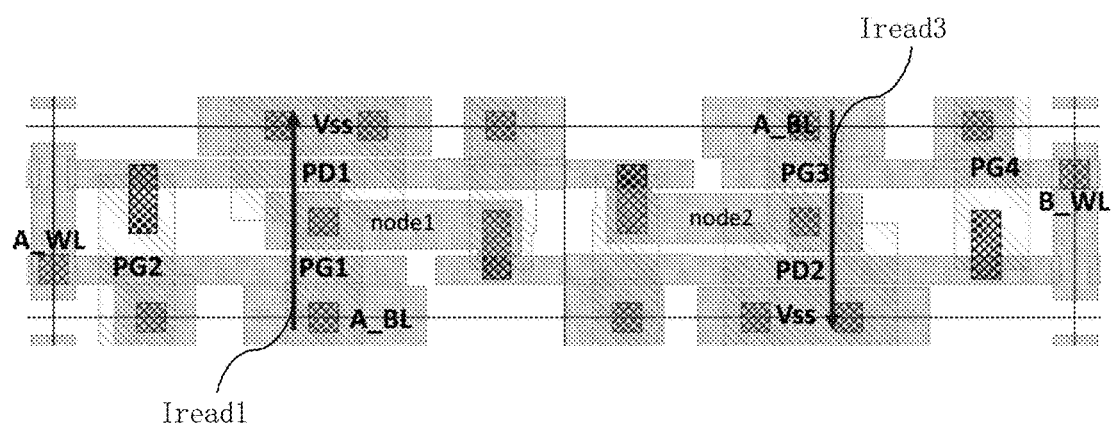
FIG. 3A shows a first current path and a third current path in the layout of the SRAM cell structure of the existing dual-port SRAM shown in FIG. 2.
Figure 3B:
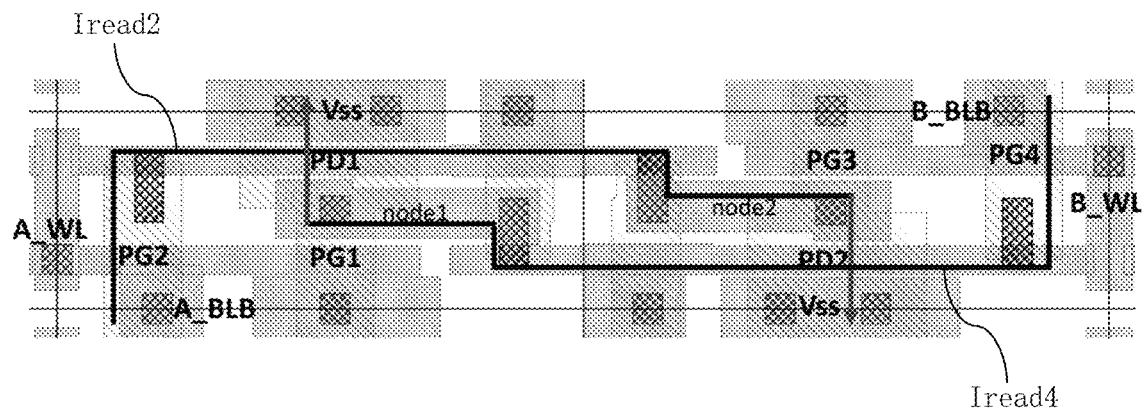
FIG. 3B shows a second current path and a fourth current path in the layout of the SRAM cell structure of the existing dual-port SRAM shown in FIG. 2.
Figure 4A:
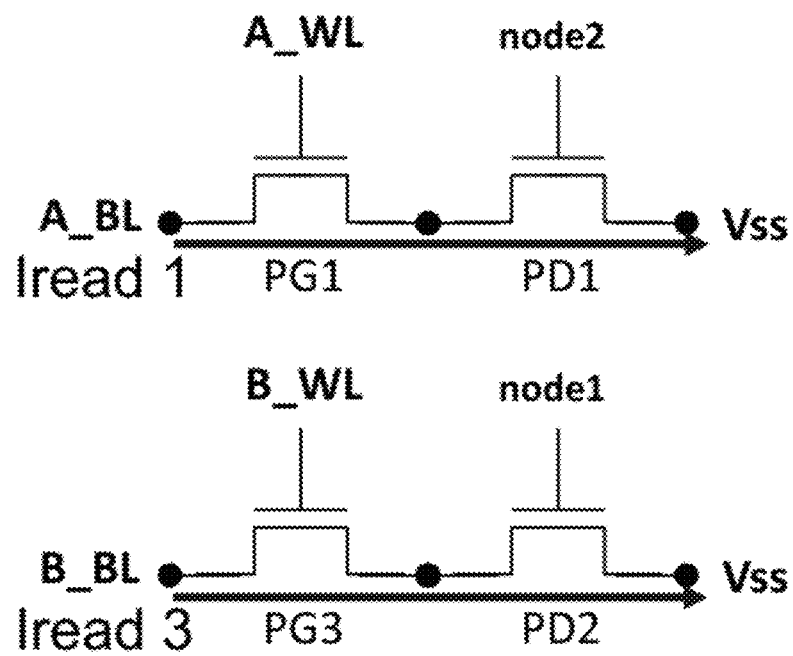
FIG. 4A shows the first current path and the third current path in the circuit diagram of the SRAM cell structure of the existing dual-port SRAM shown in FIG. 2.
Figure 4B:
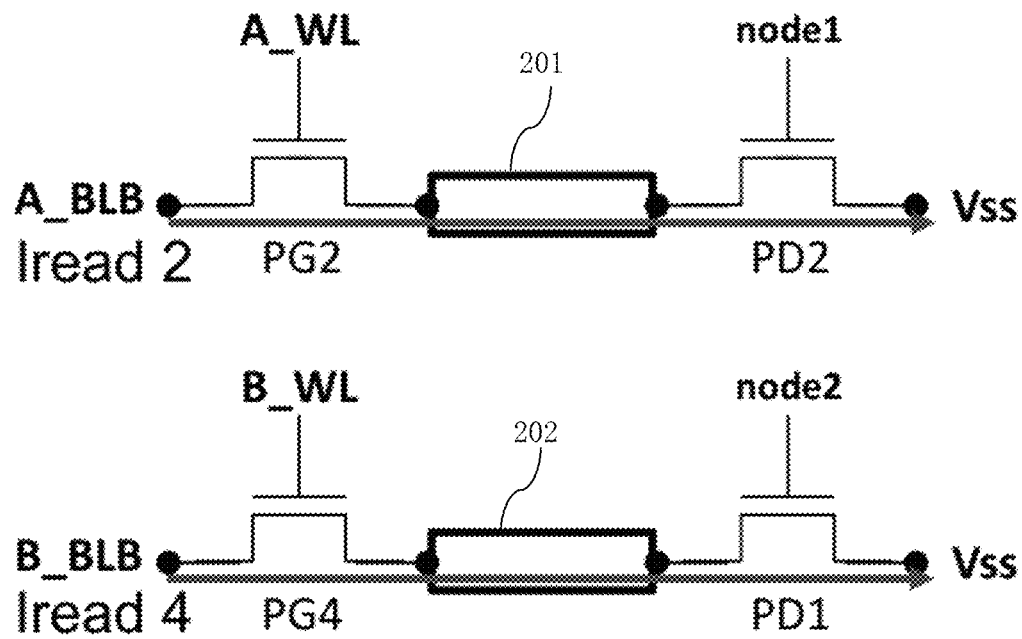
FIG. 4B shows the second current path and the fourth current path in the circuit diagram of the SRAM cell structure of the existing dual-port SRAM shown in FIG. 2.
Figure 6:
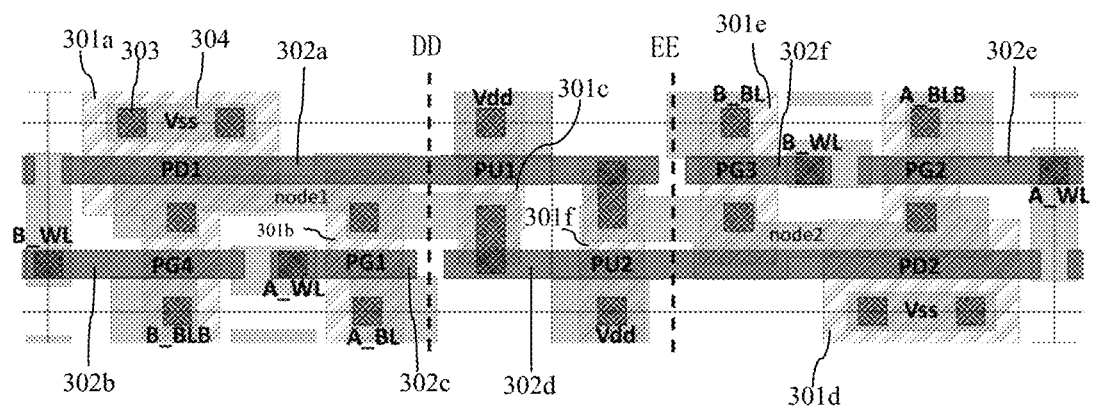
FIG. 6 shows the layout of an SRAM cell structure of a dual-port SRAM according to an embodiment of the present application.
Figure 9A:
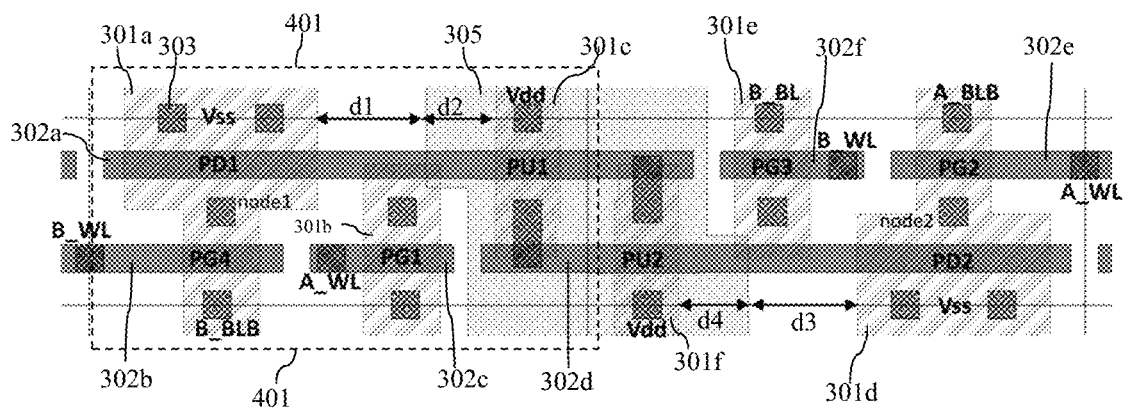
FIG. 9A shows is the layout of after the first metal layer is removed and a P-type metal work function layer is added to the SRAM cell structure of FIG. 6.
Figure 9B:
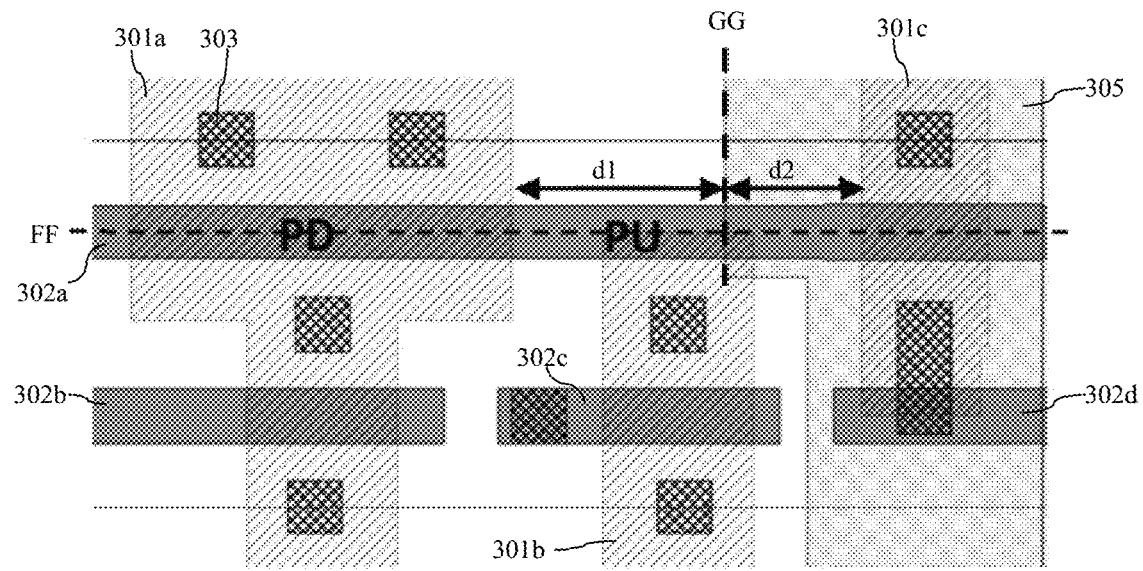
FIG. 9B is an enlarged view of the dashed line box 401 in FIG. 9A.
Figure 9C:
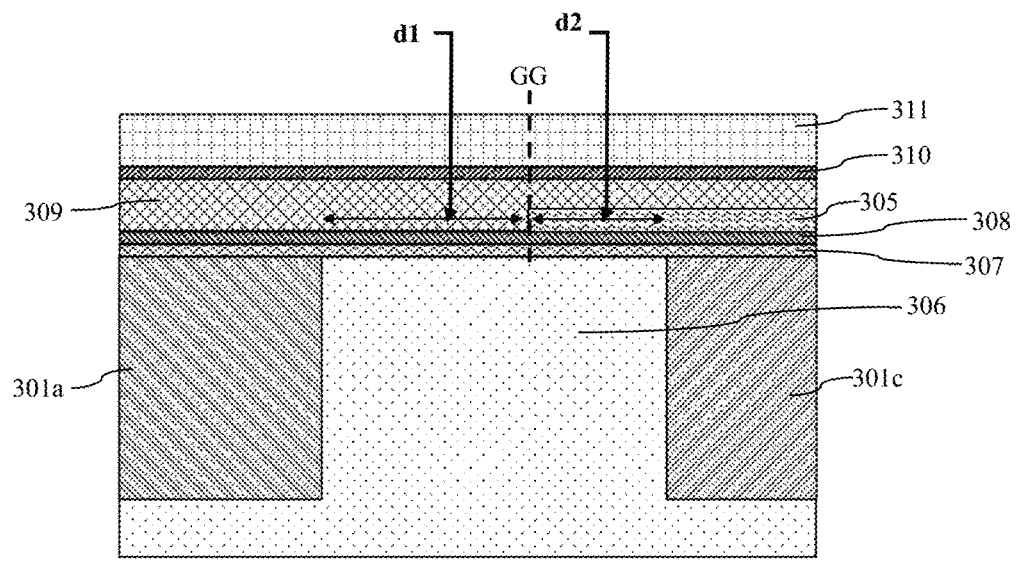
FIG. 9C is a cross sectional structural view along the line FF in FIG. 9B.

FIG. 6 is a layout of an SRAM cell structure of a dual-port SRAM according to an embodiment of the present application. Please refer to FIG. 1 for the circuit diagram of the SRAM cell structure of the dual-port SRAM according to the embodiment of the present application. FIG. 9A is a layout in which a process layer, i.e., a first metal layer 304, is removed and a P-type metal work function layer 305 is added on the basis of FIG. 6. FIG. 9B is an enlarged view of the dashed line box 401 in FIG. 9A. FIG. 9C is a cross sectional structural view along the line FF in FIG. 9B. The SRAM cell structure of the dual-port SRAM according to the embodiment of the present application includes: a data memory unit main structure, a first port structure, and a second port structure. In FIG. 1, the first port is port A, and the second port is port B.

The data memory unit main structure is formed by cross-coupling a first inverter with a second inverter, and forms a first memory node node1 and a second memory node node2 which are mutually inverted.

The first port structure includes a first pass gate PG1 and a second pass gate PG2, and the second port structure includes a third pass gate PG3 and a fourth pass gate PG4.

The first inverter includes a first pull up transistor PU1 and a first pull down transistor PD1.

The second inverter includes a second pull up transistor PU2 and a second pull down transistor PD2.

In this embodiment of the present application, the SRAM cell structure is an 8T structure comprising eight transistors. The first pull up transistor PU1 and the second pull up transistor PU2 are both PMOS transistors. The first pull down transistor PD1, the second pull down transistor PD2, the first pass gate PG1, the second pass gate PG2, the third pass gate PG3, and the fourth pass gate PG4 are all NMOS transistors.

A cell layout structure of the SRAM cell structure comprises a first subunit layout structure and a second subunit layout structure that are centrosymmetric to each other. The first subunit layout structure comprises a layout of the first pull down transistor PD1, the first pull up transistor PU1, the first pass gate PG1, and the fourth pass gate PG4, and the second subunit layout structure comprises a layout of the second pull down transistor PD2, the second pull up transistor PU2, the second pass gate PG2, and the third pass gate PG3.

The first subunit layout structure includes:

a first active region 301a, a second active region 301b, and a third active region 301c arranged in sequence in a first direction. The second active region 301b is located between the first active region 301a and the third active region 301c, and the first active region 301a, the second active region 301b, and the third active region 301c all extend in a second direction perpendicular to the first direction. In FIG. 6, the first active region 301a, the second active region 301b, and the third active region 301c are all strip structures. The first direction is the width direction of the strip structures corresponding to the first active region 301a, the second active region 301b, and the third active region 301c. The second direction is the length direction of the strip structures corresponding to the first active region 301a, the second active region 301b, and the third active region 301c.

The first pull up transistor PU1 is formed in the third active region 301c.

The first pull down transistor PD1 is located in the first active region 301a, and a drain region of the first pull down transistor PD1 forms the first memory node node1.

Figure 5A:
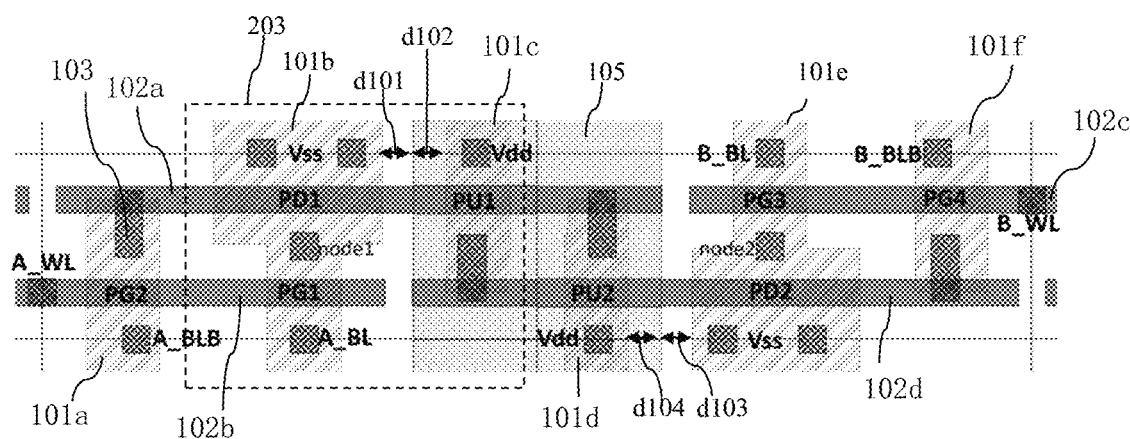
FIG. 5A is a layout shows after the first metal layer is removed and a P-type metal work function layer is added on the basis of FIG. 2.
Figure 5B:
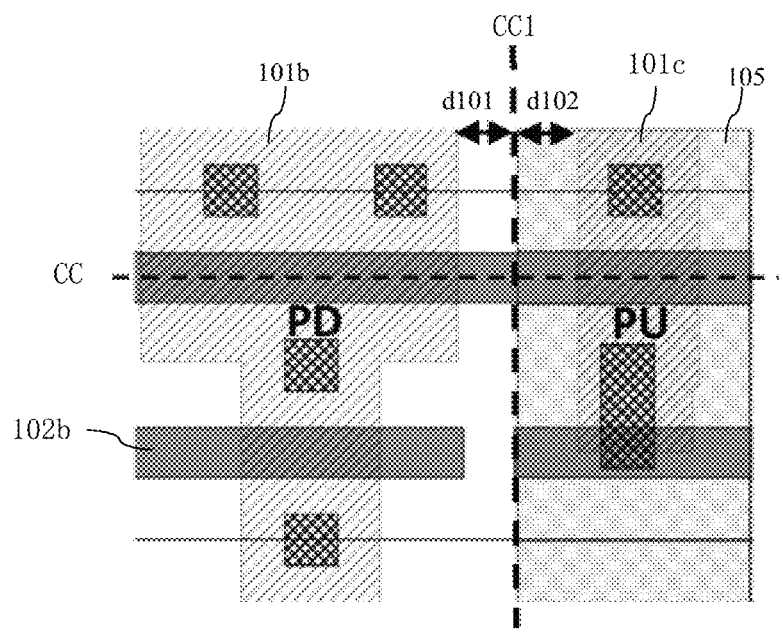
FIG. 5B is an enlarged view of the dashed line box 203 from the layout in FIG. 5A.
Figure 5C:
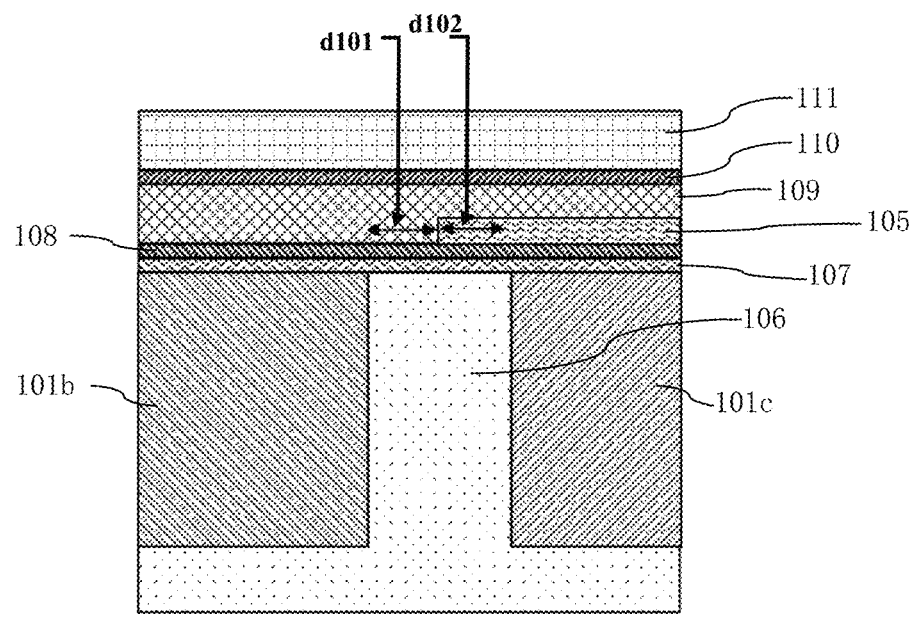
FIG. 5C is a cross sectional view along the line CC in FIG. 5B.

With reference to both FIG. 9A and FIG. 9C, a metal conductive material layer 311 of a metal gate of the first pull up transistor PU1 and a metal conductive material layer 311 of a metal gate of the first pull down transistor PD1 are connected to form a first metal gate strip 302a extending in the first direction, a first metal work function layer boundary GG between a P-type metal work function layer 305 of the metal gate of the first pull up transistor PU1 and an N-type metal work function layer 309 formed by the metal gate of the first pull down transistor PD1 is located on the top of a field oxide layer 306 between the first active region 301a and the third active region 301c, and the arrangement of the second active region 301b between the first active region 301a and the third active region 301c leads to an increase in both a first space d1 between the first metal work function layer boundary GG and the first active region 301a and a second space d2 between the first metal work function layer boundary GG line and the third active region 301c, thereby increasing the stability of the electrical performance of the first pull up transistor PU1. Upon comparison with FIG. 5B and FIG. 5C, it can be seen that the spaces d1 and d2 in the embodiment of the present application are increased compared with the spaces d101 and d102 in the existing structure.

A source region of one of the first pass gate PG1 and the fourth pass gate PG4 is the first memory node node1 and is located in the first active region 301a, and a source region of the other one of the first pass gate PG1 and the fourth pass gate PG4 is located in the second active region 301b and is connected to the first memory node node1 via a contact hole 303 and a first metal layer 304, so that neither of read paths of the first memory node node1 passes through the metal conductive material layer 311 of the metal gate connected to the first memory node node1, thereby increasing the symmetry of the two read paths of the first memory node node1. In this embodiment of the present application, a source region of the fourth pass gate PG4 is the first memory node node1 and is located in the first active region 301a, and a source region of the first pass gate PG1 is located in the second active region 301b. In other embodiments, formation regions of the first pass gate PG1 and the fourth pass gate PG4 may be interchanged.

The second subunit layout structure includes:

a fourth active region 301d, a fifth active region 301e, and a sixth active region 301f arranged in sequence in the first direction. The fifth active region 301e is located between the fourth active region 301d and the sixth active region 301f, and the fourth active region 301d, the fifth active region 301e, and the sixth active region 301f all extend in the second direction perpendicular to the first direction.

The second pull up transistor PU2 is formed in the sixth active region 301f.

The second pull down transistor PD2 is located in the fourth active region 301d, and a drain region of the second pull down transistor PD2 forms the second memory node node2.

A metal conductive material layer 311 of a metal gate of the second pull up transistor PU2 and a metal conductive material layer 311 of a metal gate of the second pull down PD2 transistor are connected to form a second metal gate strip 302d extending in the first direction, a second metal work function layer boundary between a P-type metal work function layer 305 of the metal gate of the second pull up transistor PU2 and an N-type metal work function layer 309 formed by the metal gate of the second pull down transistor PD2 is located on the top of a field oxide layer 306 between the fourth active region 301d and the sixth active region 301f, and the arrangement of the fifth active region 301e between the fourth active region 301d and the sixth active region 301f leads to an increase in both a third space d3 between the second metal work function layer boundary and the fourth active region 301d and a fourth space d4 between the second metal work function layer boundary and the sixth active region 301f, thereby increasing the stability of the electrical performance of the second pull up transistor PU2.

A source region of one of the second pass gate PG2 and the third pass gate PG3 is the second memory node node2 and is located in the fourth active region 301d, and a source region of the other one of the second pass gate PG2 and the third pass gate PG3 is located in the fifth active region 301e and is connected to the second memory node node2 via a contact 303 and the first metal layer 304, so that neither of read paths of the second memory node node2 passes through the metal conductive material layer 311 of the metal gate connected to the second memory node node2, thereby increasing the symmetry of the two read paths of the second memory node node2. In this embodiment of the present application, a source region of the second pass gate PG2 is the second memory node node2 and is located in the fourth active region 301d, and a source region of the third pass gate PG3 is located in the fifth active region 301e. In other embodiments, formation regions of the second pass gate PG2 and the third pass gate PG3 may be interchanged.

The third space d3 is equal to the first space d1, and the fourth space d4 is equal to the second space d2.

Figure 7A:
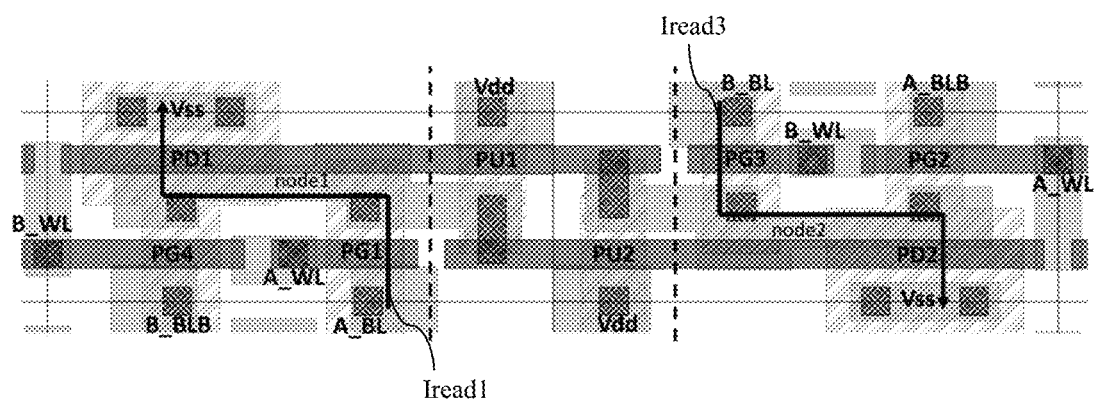
FIG. 7A shows a first current path and a third current path in the layout of the SRAM cell structure of the dual-port SRAM according to the embodiment of the present application.

FIG. 7A is a schematic diagram of a first current path and a third current path in the layout of the SRAM cell structure of the dual-port SRAM according to the embodiment of the present application. The first current path corresponds to a path of a current Iread1, and the third current path corresponds to a path of a current Iread3. It can be seen that the first current path is used to read the first memory node node1, and a read voltage is applied to a first bit line A_BL during reading. The first current path is located between the first bit line A_BL and a ground line Vss connected to a source region of the first pull down transistor PD1. The first current path passes through the first pass gate PG1, and the first metal layer 304 and the first pull down transistor PD1 connected via the contact 302. The third current path is used to read the second memory node node2, and a read voltage is applied to a third bit line B_BL during reading. The third current path is located between the third bit line B_BL and the ground line Vss connected to a source region of the second pull down transistor PD2. The third current path passes through the third pass gate PG3, and the first metal layer 304 and the second pull down transistor PD2 connected via the contact 302. It can be seen that the symmetry between the first current path and the third current path is good, and neither the first current path nor the third current path passes through a metal gate strip with high resistance.

Figure 7B:
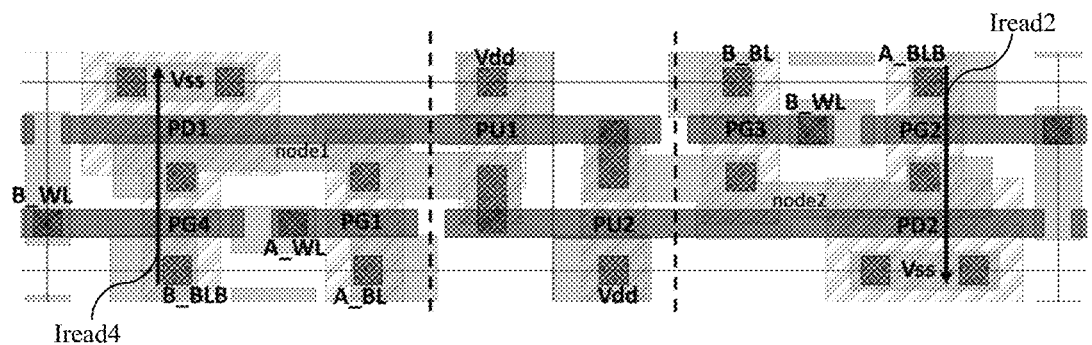
FIG. 7B shows a second current path and a fourth current path in the layout of the SRAM cell structure of the dual-port SRAM according to the embodiment of the present application.

FIG. 7B is a schematic diagram of a second current path and a fourth current path in the layout of the SRAM cell structure of the dual-port SRAM according to the embodiment of the present application. The second current path corresponds to a path of a current Iread2, and the fourth current path corresponds to a path of a current Iread4. It can be seen that the fourth current path is used to read the first memory node node1, and a read voltage is applied to a fourth bit line B_BLB during reading. The fourth current path is located between the fourth bit line B_BLB and the ground line Vss connected to the source region of the first pull down transistor PD1. The fourth current path passes through the fourth pass gate PG4 and the first pull down transistor PD1. The second current path is used to read the second memory node node2, and a read voltage is applied to a second bit line A_BLB during reading. The second current path is located between the second bit line A_BLB and the ground line Vss connected to the source region of the second pull down transistor PD2. The second current path passes through the second pass gate PG2 and the second pull down transistor PD2. It can be seen that the symmetry between the second current path and the fourth current path is good, and neither the second current path nor the fourth current path passes through a metal gate strip with high resistance. In addition, compared with the second current path and the fourth current path, only a section of the first metal layer 304 is added to both the first current path and the third current path. Since the resistance of the first metal layer 304 is relatively small, the four current paths, i.e., the first to fourth current paths, have good matching to each other.

Figure 8A:
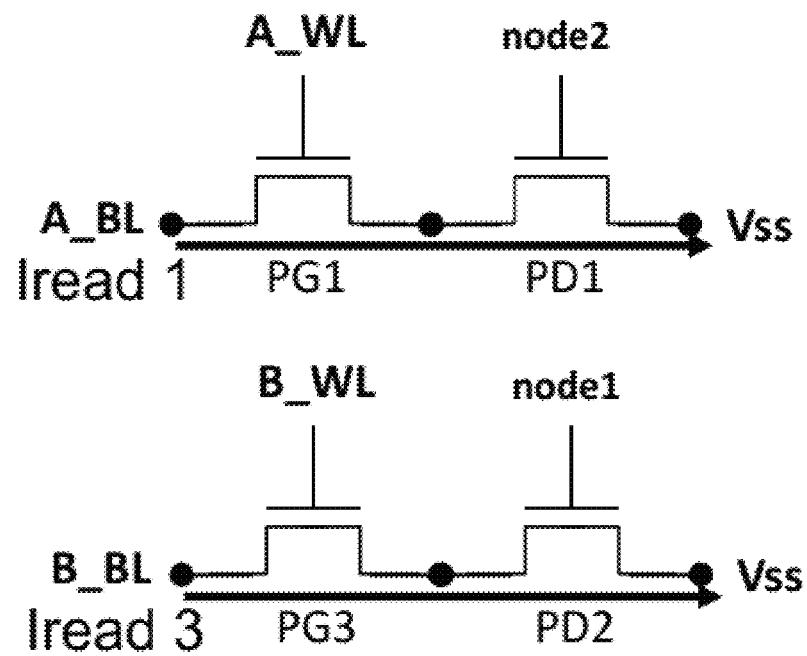
FIG. 8A shows the first current path and the third current path in the circuit diagram of the SRAM cell structure of the dual-port SRAM in FIG. 6, according to the embodiment of the present application.

FIG. 8A shows the first current path and the third current path in the circuit diagram of the SRAM cell structure of the dual-port SRAM in FIG. 6, according to the embodiment of the present application. It can be seen that the paths of the current Iread1 and the current Iread3 have good matching to each other.

Figure 8B:
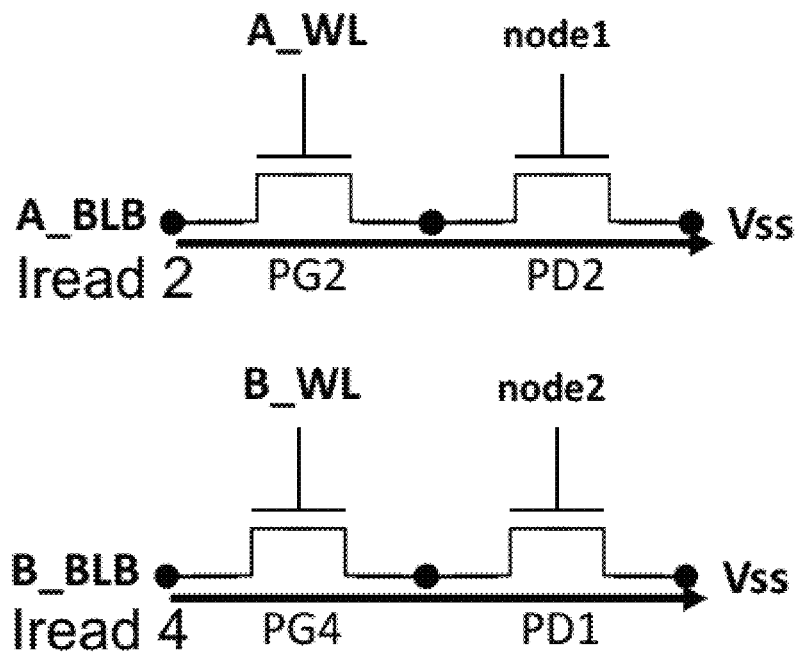
FIG. 8B shows the second current path and the fourth current path in the circuit diagram of the SRAM cell structure of the dual-port SRAM in FIG. 6, according to the embodiment of the present application.

FIG. 8B shows the second current path and the fourth current path in the circuit diagram of the SRAM cell structure of the dual-port SRAM in FIG. 6, according to the embodiment of the present application. It can be seen that the paths of the current Iread2 and the current Iread4 have good matching to each other.

In the first active region 301a, the fourth pass gate PG4 and the first pull down transistor PD1 are arranged along the second direction.

A metal conductive material layer 311 of a metal gate of the fourth pass gate PG4 and a metal conductive material layer 311 of a metal gate of the first pass gate PG1 are aligned with the second metal gate strip 302d. In FIG. 6, the metal conductive material layer 311 of the metal gate of the fourth pass gate PG4 forms a metal gate strip 302b, and the metal conductive material layer 311 of the metal gate of the first pass gate PG1 forms a metal gate strip 302c.

The width of a channel region of the fourth pass gate PG4 is equal to a first direction dimension, i.e., the width, of the first active region 301a of a formation region of the fourth pass gate PG4.

The width of a channel region of the first pull down transistor PD1 is equal to a first direction dimension of the first active region 301a of a formation region of the first pull down transistor PD1.

The width of a channel region of the first pass gate PG1 is equal to a first direction dimension of the second active region 301b.

The width of the channel region of the fourth pass gate PG4 is less than the width of the channel region of the first pull down transistor PD1. That is, the width of the first active region 301a varies, and the width of the first active region 301a in the formation region of the first pull down transistor PD1 is increased.

The width of the channel region of the fourth pass gate PG4 is equal to the width of the channel region of the first pass gate PG1.

In the fourth active region 301d, the second pass gate PG2 and the second pull down transistor PD2 are arranged along the second direction.

A metal conductive material layer 311 of a metal gate of the second pass gate PG2 and a metal conductive material layer 311 of a metal gate of the third pass gate PG3 are aligned with the first metal gate strip 302a. In FIG. 6, the metal conductive material layer 311 of the metal gate of the second pass gate PG2 forms a metal gate strip 302e, and the metal conductive material layer 311 of the metal gate of the third pass gate PG3 forms a metal gate strip 302f.

The width of a channel region of the second pass gate PG2 is equal to a first direction dimension of the fourth active region 301d of a formation region of the second pass gate PG2.

The width of a channel region of the second pull down transistor PD2 is equal to a first direction dimension of the fourth active region 301d of a formation region of the second pull down transistor PD2.

The width of a channel region of the third pass gate PG3 is equal to a first direction dimension of the fifth active region 301e.

The width of the channel region of the second pass gate PG2 is less than the width of the channel region of the second pull down transistor PD2, and the width of the channel region of the second pass gate PG2 is equal to the width of the channel region of the third pass gate PG3.

The top of the metal conductive material layer 311 of the metal gate of the first pass gate PG1 is connected to the first metal layer 304 corresponding to a first word line A_WL via a contact 303.

The top of the metal conductive material layer 311 of the metal gate of the fourth pass gate PG4 is connected to the first metal layer 304 corresponding to a second word line B_WL via a contact 303.

The top of a drain region of the first pass gate PG1 is connected to the first metal layer 304 corresponding to a first bit line A_BL via a contact 303.

The top of a drain region of the fourth pass gate PG4 is connected to the first metal layer 304 corresponding to a fourth bit line B_BLB via a contact 303.

The top of a source region of the first pull down transistor PD1 is connected to the first metal layer 304 corresponding to a ground line Vss via a contact 303.

The top of the drain region of the first pull down transistor PD1, the top of a source region of the first pass gate PG1, the top of a drain region of the first pull up transistor PU1, and the top of the second metal gate strip 302d are respectively connected to the first metal layer 304 corresponding to the first memory node node1 via contacts 303.

The top of a source region of the first pull up transistor PU1 is connected to the first metal layer 304 corresponding to a power supply voltage line Vdd via a contact 303.

The top of the metal conductive material layer 311 of the metal gate of the second pass gate PG2 is connected to the first metal layer 304 corresponding to a first word line A_WL via a contact 303.

The top of the metal conductive material layer 311 of the metal gate of the third pass gate PG3 is connected to the first metal layer 304 corresponding to a second word line B_WL via a contact 303.

The top of a drain region of the second pass gate PG2 is connected to the first metal layer 304 corresponding to a second bit line A_BLB via a contact 303. The second bit line A_BLB and the first bit line A_BL form a first pair of complementary bit lines.

The top of a drain region of the third pass gate PG3 is connected to the first metal layer 304 corresponding to a third bit line B_BL via a contact 303. The third bit line B_BL and the fourth bit line B_BLB form a second pair of complementary bit lines.

The top of a source region of the second pull down transistor PD2 is connected to the first metal layer 304 corresponding to a ground line Vss via a contact 303.

The top of a drain region of the second pull down transistor PD2, the top of a source region of the third pass gate PG3, the top of a drain region of the second pull up transistor PU2, and the top of the first metal gate strip 302a are respectively connected to the first metal layer 304 corresponding to the second memory node node2 via contacts 303.

The top of a source region of the second pull up transistor PU2 is connected to the first metal layer 304 corresponding to a power supply voltage line Vdd via a contact 303.

The first active region 301a and the second active region 301b are both located in a first P-well. In FIG. 6, a formation region of the first P-well is located on the left side of the dashed line DD. The first active region 301a and the second active region 301b are isolated by forming the field oxide layer 306 in the first P-well.

The third active region 301c and the sixth active region 301f are both located in an N-well. In FIG. 6, a formation region of the N-well is located between the dashed line DD and the dashed line EE.

The fourth active region 301d and the fifth active region 301e are both located in a second P-well. In FIG. 6, a formation region of the second P-well is located on the right side of the dashed line EE. The fourth active region 301d and the fifth active region 301e are isolated by forming the field oxide layer 306 in the second P-well.

On the cell layout structure of the SRAM cell structure, the N-well is located in a middle region, and the first P-well and the second P-well are located on two sides of the N-well.

Referring to FIG. 9C, the metal gate of the PMOS includes the P-type metal work function layer 305, the N-type metal work function layer 309, and the metal conductive material layer 311 stacked in sequence.

The metal gate of the NMOS includes the N-type metal work function layer 309 and the metal conductive material layer 311 stacked in sequence.

A gate dielectric layer 307 is formed at the bottom of the metal gate of each of the PMOS and the NMOS, and the gate dielectric layer 307 includes a high dielectric constant layer.

A bottom barrier layer 308 is formed on the surface of the gate dielectric layer 307, and a top barrier layer 310 is formed on the surface of the N-type metal work function layer 309.

The material of the P-type metal work function layer 305 includes TiN.

The material of the N-type metal work function layer 309 includes TiAl.

The material of the metal conductive material layer 311 includes Al.

The material of the high dielectric constant layer includes hafnium dioxide, the material of the bottom barrier layer 308 includes a stack layer of TiN and TaN, and the material of the top barrier layer 310 includes TiN.

In the embodiment of the present application, the cell layout structure of the SRAM cell structure comprises the first subunit layout structure and the second subunit layout structure that are centrosymmetric to each other. The first subunit layout structure includes a pass gate of the first port structure, i.e., the first pass gate PG1, and a pass gate of the second port structure, i.e., the fourth pass gate PG4, so that the first pass gate PG1 and the fourth pass gate PG4 are disposed adjacent to the first memory node node1 in the first subunit layout structure and that neither of the two read paths of the first memory node node1 passes through the metal conductive material layer 311 of the metal gate connected to the first memory node node1, thereby increasing the symmetry of the two read paths of the first memory node node1. Since the first subunit layout structure and the second subunit layout structure are centrosymmetric, the symmetry of the read paths of the two memory nodes from each port can be eventually improved, thereby improving the symmetry of read currents.

Moreover, in the first subunit layout structure of the embodiment of the present application, one pass gate and the first pull down transistor PD1 are formed in the same active region, i.e., the first active region 301a, and the other pass gate is separately disposed in the second active region 301b. The second active region 301b is disposed between the first active region 301a and the third active region 301c of the first pull up transistor PU1. In this way, a space between the first active region 301a and the third active region 301c can be increased. Accordingly, the first space d1 between the first active region 301a and the first metal work function layer boundary GG which is formed by a lateral contact between side surfaces of the P-type metal work function layer 305 of the metal gate of the first pull up transistor PU1 comprises the PMOS and the N-type metal work function layer 309 of the metal gate of the first pull down transistor PD1, and the second space d2 between the first metal work function layer boundary and the third active region 301c both can be increased. The channel region of the first pull up transistor PU1 is the third active region 301c covered by the metal gate. Therefore, after the first space d1 and the second space d2 are increased, the amount of impurities in the N-type metal work function layer 309 of the first pull down transistor PD1 diffused into the P-type metal work function layer 305 on the top of the channel region of the first pull up transistor pu1 can be reduced, reducing the variation amount of the electrical performance of the PMOS and thereby improving the stability of the electrical performance of the PMOS.

The present application is described in detail above by using specific embodiments, which, however, are not intended to limit the present application. Without departing from the principles of the present application, those skilled in the art can also make many modifications and improvements, which should also be regarded as the scope of protection of the present application.

What is claimed is:

1. A dual-port SRAM cell structure, comprising:
a data memory unit main structure, a first port structure, and a second port structure;
   wherein the data memory unit main structure comprises:
   a first inverter and a second inverter cross-coupled to each other, and a first memory node and a second memory node mutually inverted to each other;
   wherein the first port structure comprises a first pass gate and a second pass gate, and wherein the second port structure comprises a third pass gate and a fourth pass gate;
   wherein the first inverter comprises a first pull up transistor and a first pull down transistor;
   wherein the second inverter comprises a second pull up transistor and a second pull down transistor;
   wherein the first pull up transistor and the second pull up transistor are both PMOS transistors; and
   wherein the first pull down transistor, the second pull down transistor, the first pass gate, the second pass gate, the third pass gate, and the fourth pass gate are all NMOS transistors;
wherein the dual-port SRAM cell structure is designed with a cell layout structure, which comprises a first subunit layout structure and a second subunit layout structure that are centrosymmetric to each other;
   wherein the first subunit layout structure comprises layouts of the first pull down transistor, the first pull up transistor, the first pass gate, and the fourth pass gate;
   wherein the second subunit layout structure comprises layouts of the second pull down transistor, the second pull up transistor, the second pass gate, and the third pass gate;
   wherein the first subunit layout structure further comprises:
   a first active region, a second active region, and a third active region, wherein the second active region is located between the first active region and the third active region, and wherein the first active region, the second active region, and the third active region are arranged in sequence in a first direction and extend in a second direction perpendicular to the first direction;
   wherein the first pull up transistor is arranged in the third active region;
   wherein the first pull down transistor is located in the first active region, and a drain region of the first pull down transistor is configured to be the first memory node;
   wherein a metal conductive material layer of a metal gate of the first pull up transistor and a metal conductive material layer of a metal gate of the first pull down transistor are electrically connected to form a first metal gate strip extending in the first direction, wherein a P-type metal work function layer in the metal gate of the first pull up transistor and an N-type metal work function layer in the metal gate of the first pull down transistor share a boundary of first work function layers, wherein the boundary is disposed on a top of a field oxide layer between the first active region and the third active region;
   wherein the second active region is arranged between the first active region and the third active region;

wherein a first space located between the boundary of first work function layers and the first active region and a second space between the boundary of first work function layers and the third active region are set to meet design rules in the layout structures;
wherein a source region of one of the first pass gate and the fourth pass gate is located in the first active region and configured to connect to the first memory node;
wherein a source region of another one of the first pass gate and the fourth pass gate is located in the second active region and is configured to connect to the first memory node via a contact hole and a first metal layer; and
wherein read paths passing through the metal conductive material layers connected to the first memory nodes are centrosymmetric;
wherein the second subunit layout structure comprises:
a fourth active region, a fifth active region, and a sixth active region arranged in sequence in the first direction, wherein the fifth active region is located between the fourth active region and the sixth active region, and wherein the fourth active region, the fifth active region, and the sixth active region extend along the second direction;
wherein the second pull up transistor is disposed in the sixth active region;
wherein the second pull down transistor is disposed in the fourth active region, and wherein a drain region of the second pull down transistor is configured to be the second memory node;
wherein a metal conductive material layer of a metal gate of the second pull up transistor and a metal conductive material layer of a metal gate of the second pull down transistor are connected to form a second metal gate strip extending along the first direction;
wherein a P-type metal work function layer of the metal gate of the second pull up transistor and an N-type metal work function layer formed by the metal gate of the second pull down transistor share a boundary of second work function layers, wherein said boundary is disposed on a top of a field oxide layer between the fourth active region and the sixth active region;
wherein a third space located between the boundary of the second work function layers and the fourth active region, and a fourth space between the boundary of second work function layers and the sixth active region are set to meet design rules in the layout structures; and
wherein a source region of one of the second pass gate and the third pass gate is located in the fourth active region and is configured to connect to the second memory node;
wherein a source region of another one of the second pass gate and the third pass gate is located in the fifth active region and is connected to the second memory node via a contact hole and the first metal layer; and
wherein read paths passing through the metal conductive material layers connected to the second memory node are centrosymmetric;
wherein the fourth pass gate is disposed in the first active region, and the first pass gate is formed in the second active region;
wherein in the first active region, the fourth pass gate and the first pull down transistor are arranged along the second direction; and
wherein a metal conductive material layer of a metal gate of the fourth pass gate and a metal conductive material layer of a metal gate of the first pass gate are aligned with the second metal gate strip.

2. The dual-port SRAM cell structure according to claim 1, wherein the third space is equal to the first space, and the fourth space is equal to the second space.

3. The dual-port SRAM cell structure according to claim 1, wherein a width of a channel region of the fourth pass gate is equal to a dimension of the first active region of a formation region of the fourth pass gate in the first direction;
wherein a width of a channel region of the first pull down transistor is equal to a dimension of the first active region of a formation region of the first pull down transistor in the first direction;
wherein a width of a channel region of the first pass gate is equal to a dimension of the second active region in the first direction;
wherein the width of the channel region of the fourth pass gate is less than a width of the channel region of the first pull down transistor; and
wherein the width of the channel region of the fourth pass gate is equal to a width of the channel region of the first pass gate.

4. The dual-port SRAM cell structure according to claim 1, wherein the second pass gate is disposed in the fourth active region, and wherein the third pass gate is disposed in the fifth active region.

5. The dual-port SRAM cell structure according to claim 4, wherein in the fourth active region, the second pass gate and the second pull down transistor are arranged along the second direction; and
wherein a metal conductive material layer of a metal gate of the second pass gate and a metal conductive material layer of a metal gate of the third pass gate are aligned with the first metal gate strip.

6. The dual-port SRAM cell structure according to claim 5, wherein a width of a channel region of the second pass gate is equal to a dimension of the fourth active region of a formation region of the second pass gate in the first direction;
wherein a width of a channel region of the second pull down transistor is equal to a dimension of a fourth active region of a formation region of the second pull down transistor in the first direction;
wherein a width of a channel region of the third pass gate is equal to a dimension of the fifth active region in the first direction;
wherein the width of the channel region of the second pass gate is less than the width of the channel region of the second pull down transistor; and
wherein the width of the channel region of the second pass gate is equal to the width of the channel region of the third pass gate.

7. The dual-port SRAM cell structure according to claim 1, wherein a top of the metal conductive material layer of the metal gate of the first pass gate is connected to the first metal layer corresponding to a first word line via a contact hole;
wherein a top of the metal conductive material layer of the metal gate of the fourth pass gate is connected to the first metal layer corresponding to a second word line via a contact hole;
wherein a top of a drain region of the first pass gate is connected to the first metal layer corresponding to a first bit line via a contact hole;
wherein a top of a drain region of the fourth pass gate is connected to a first metal layer corresponding to a fourth bit line via a contact hole;

wherein a top of a source region of the first pull down transistor is connected to the first metal layer corresponding to a ground line via a contact hole;

wherein a top of the drain region of the first pull down transistor, a top of a source region of the first pass gate, a top of a drain region of the first pull up transistor, and a top of the second metal gate strip are respectively connected to the first metal layer corresponding to the first memory node via contact holes; and wherein a top of a source region of the first pull up transistor is connected to the first metal layer corresponding to a power supply voltage line via a contact hole.

8. The dual-port SRAM cell structure according to claim 5, wherein a top of the metal conductive material layer of the metal gate of the second pass gate is connected to the first metal layer corresponding to a first word line via a contact hole;

wherein a top of a metal conductive material layer of a metal gate of the third pass gate is connected to the first metal layer corresponding to a second word line via a contact hole;

wherein a top of a drain region of the second pass gate is connected to the first metal layer corresponding to a second bit line via a contact hole;

wherein a top of a drain region of the third pass gate is connected to the first metal layer corresponding to a third bit line via a contact hole;

wherein a top of a source region of the second pull down transistor is connected to the first metal layer corresponding to a ground line via a contact hole;

wherein a top of a drain region of the second pull down transistor, a top of a source region of the third pass gate, a top of a drain region of the second pull up transistor, and a top of the first metal gate strip are respectively connected to the first metal layer corresponding to the second memory node via contact holes; and wherein a top of a source region of the second pull up transistor is connected to the first metal layer corresponding to a power supply voltage line via a contact hole.

9. The dual-port SRAM cell structure according to claim 1, wherein the first active region and the second active region are both located in a first P-well;

wherein the third active region and the sixth active region are both located in an N-well;

wherein the fourth active region and the fifth active region are both located in a second P-well; and wherein on the cell layout structure of the SRAM cell structure, the N-well is located in a middle region, and the first P-well and the second P-well are located on two sides of the N-well.

10. The dual-port SRAM cell structure according to claim 1, wherein in the metal gate of the PMOS, the P-type metal work function layer, the N-type metal work function layer, and the metal conductive material layer are stacked in sequence; and wherein in the metal gate of the NMOS, the N-type metal work function layer and the metal conductive material layer are stacked in sequence.

11. The dual-port SRAM cell structure according to claim 10, wherein a gate dielectric layer is formed at a bottom of the metal gate of each of the PMOS and the NMOS, and wherein the gate dielectric layer comprises a high dielectric-constant layer; and wherein a bottom barrier layer is formed on a surface of the gate dielectric layer, and a top barrier layer is formed on a surface of the N-type metal work function layer.

12. The dual-port SRAM cell structure according to claim 10, wherein a material of the P-type metal work function layer comprises TiN;

wherein a material of the N-type metal work function layer comprises TiAl; and wherein a material of the metal conductive material layer comprises Al.

13. The dual-port SRAM cell structure according to claim 11, wherein a material of the high dielectric-constant layer comprises hafnium dioxide, wherein a material of the bottom barrier layer comprises a stack of TiN and TaN layers, and wherein a material of the top barrier layer comprises TiN.

* * * * *